United States Patent [19]
Kim et al.

[11] Patent Number: 5,199,164
[45] Date of Patent: Apr. 6, 1993

[54] METHOD OF MANUFACTURING SEMICONDUCTOR PACKAGE

[75] Inventors: Gu S. Kim; Young S. Kim, both of Seoul, Rep. of Korea

[73] Assignee: Samsung Electronics Co., Ltd., Suweon, Rep. of Korea

[21] Appl. No.: 859,663

[22] Filed: Mar. 30, 1992

Related U.S. Application Data

[62] Division of Ser. No. 706,898, May 29, 1991, Pat. No. 5,157,588.

[30] Foreign Application Priority Data

Mar. 30, 1991 [KR] Rep. of Korea ............... 91-5087

[51] Int. Cl.$^5$ ............................................. H05K 3/34
[52] U.S. Cl. ................................. 29/840; 165/803; 165/185; 361/387; 361/388; 257/712
[58] Field of Search .............. 357/81, 80; 29/840; 165/80.3, 185; 361/412, 387, 388

[56] References Cited

U.S. PATENT DOCUMENTS

| | | |
|---|---|---|
| 4,561,011 | 12/1985 | Kohara et al. |
| 4,654,966 | 4/1987 | Kohara et al. ................ 29/840 |
| 4,716,498 | 12/1987 | Ellis . |
| 4,771,365 | 9/1988 | Cichocki et al. ............ 361/412 X |
| 4,867,235 | 9/1989 | Grapes et al. ............... 357/81 X |
| 5,097,318 | 3/1992 | Tanaka et al. ............... 357/80 X |

Primary Examiner—Carl J. Arbes
Attorney, Agent, or Firm—Ladas & Parry

[57] ABSTRACT

The present invention relates to a semiconductor package which is loaded with a plurality of high-performance integrated circuits for high-performance systems such as super computers and large-sized computers. According to the invention, the packaging density of the semiconductor is doubled by stacking upper and lower members and forming substrates loaded with a plurality of chips in a multistep structure so that the size of computers can be minimized and heat emission efficiency can be improved by forming heat sinks in a fin-pin shape.

4 Claims, 2 Drawing Sheets

METHOD OF MANUFACTURING SEMICONDUCTOR PACKAGE

This is a divisional of copending application Ser. No. 07/706,898 filed on May 29, 1991.

BACKGROUND OF THE INVENTION

The present invention relates to a semiconductor package which can load many high-performance ICS (integrated circuits) to increase packaging density for high-performance systems such as super computers and large-sized computers.

Generally, the size of computers increases correspondingly to the capacity of computers. Therefore, high-integration chips and semiconductor packages have been developed in order to reduce the size of the computers. In other words, a semiconductor package as shown in FIG. 4 which can load many high-integration chips has been developed. In this semiconductor package as shown in FIG. 4, a plurality of IC chip 31 are loaded on an wiring substrate 32 which is provided with wires and electrodes thereon. The wires are connected to leads 33 which pass through the wiring substrate 32. Also, a heat sink 34 is formed on the chips 31 and provided with a plurality of holes 34a for air flow.

In this semiconductor package 30, however, many chips 31 are formed on the wiring substrate 32 only in one-row so that the packaging density is not enough to reduce the size of the semiconductor package.

SUMMARY OF THE INVENTION

The present invention has been made in consideration of this and has it for object to provide a semiconductor device which improves the packaging density by forming a plurality of wiring substrates provided with the chips in a multistep structure so as to minimize the size of the products such as the large-sized computers.

Another object of the invention is to provide a method of manufacturing a multichip-module of semiconductor package by loading the wiring substrates in the multistep structure and connecting them electrically.

According to the invention, there is provided a semiconductor package comprising; upper and lower members which are formed in a stacked-structure, coupled with pads at the center of each member, substrates attached to said upper and lower members, on which a plurality of high integration chips are loaded and circuit patterns are wire-bonded with the surface thereof, connection means for connecting electrically the chips on said substrates, external leads connected to the connection means, and a heat sink formed at outside surfaces of said upper and lower members. Also, according to the present invention, there is provided a method of manufacturing a semiconductor package, comprising the following steps: preparing upper and lower members at the center of which pad is inserted, attaching substrates provided with a plurality of chips to insides of upper and lower members, interconnecting electrically said chips attached to said substrates in each of said upper and lower members, connecting electrically the upper member to the lower member through connecting pads and simultaneously sealing the upper and lower members, and forming a heat sink for emitting internal heat to the outside.

BRIEF DESCRIPTION OF THE DRAWINGS

These and other objects, features, and advantages of the present invention will become more apparent following description for the preferred embodiments taken in conjunction with the accompanying drawings, in which.

DETAILED DESCRIPTION OF THE INVENTION

The present invention will now be described in more detail with reference to accompanying drawings.

Figure 1:
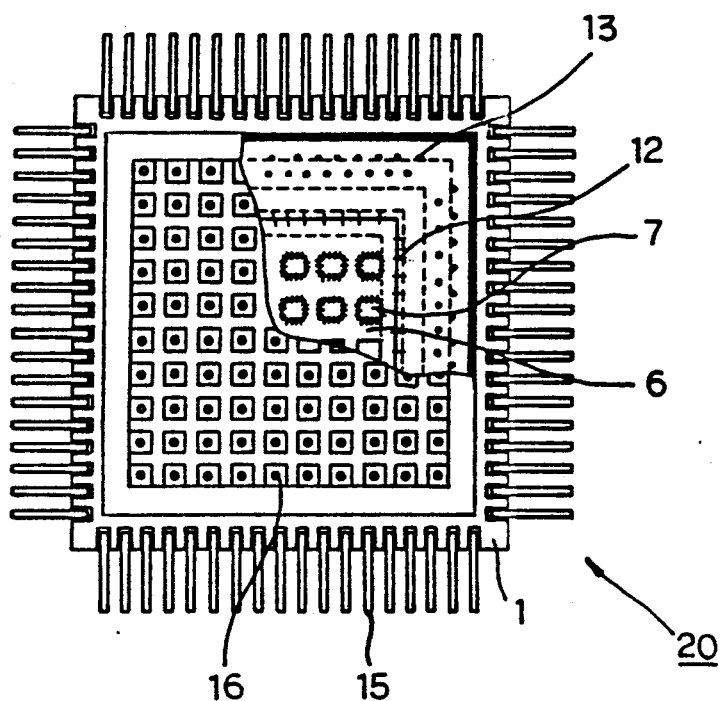
FIG. 1 is a partially cutaway plane view of the semiconductor package, according to the present invention.
Figure 2:
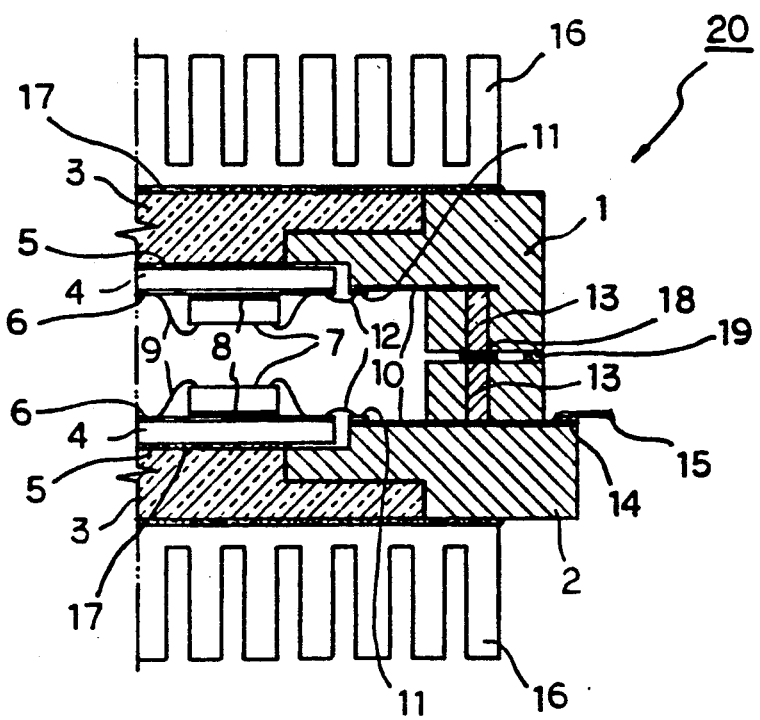
FIG. 2 is a partially expanded view of the semiconductor package as shown in FIG. 1.
Figure 3:
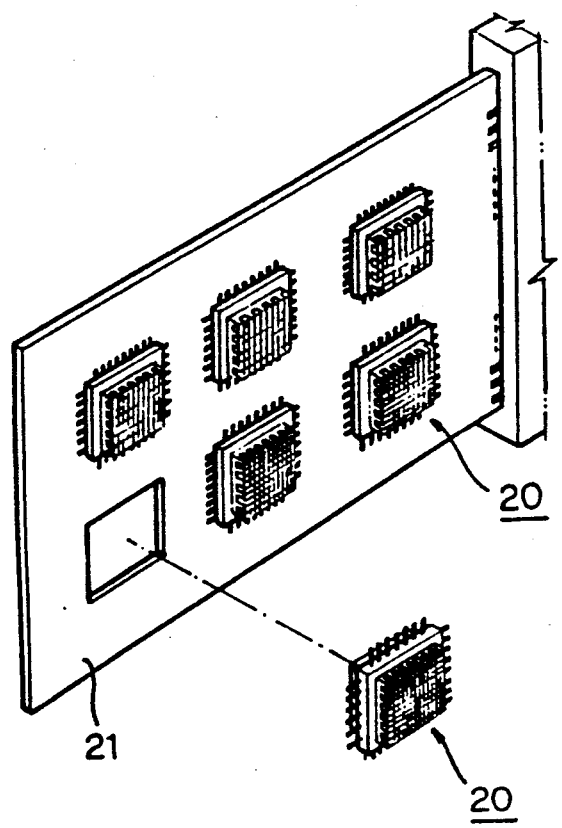
FIG. 3 is a perspective view of semiconductor package set on a board according to the invention.
Figure 4:
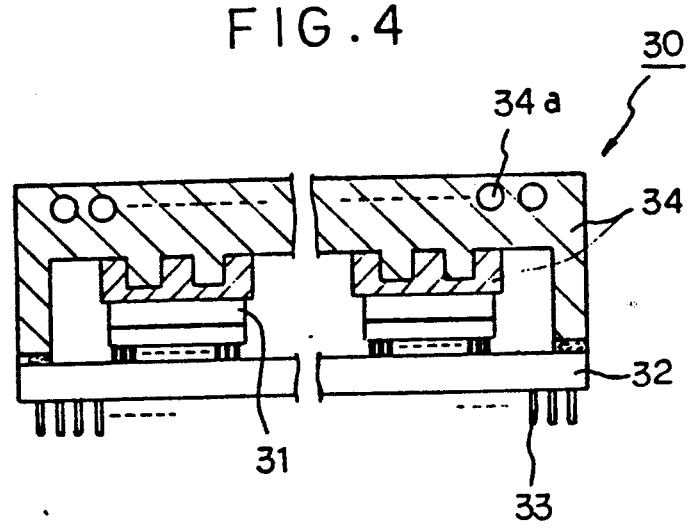
FIG. 4 is a partial cross-sectional view of a conventional semiconductor device.

FIGS. 1 and 2 show a semiconductor package according to the present invention. In FIGS. 1 and 2 upper and lower members 1 and 2 are formed of insulating materials into a multistep structure, and pads 3 which are brazed out of Cu-Ag materials are formed at each center of the upper and lower members 1 and 2. Substrates 4 are attached on of the upper and lower members 1 and 2, and on the pads 3. The upper and lower members 1 and 2 are usually made of ceramic and the pad 3 is made of Cu-W or Cu-Mo in consideration of thermal conduction and thermal expansion. And, an adhesive agent is to be Au-2% Si.

Thin films 6 provided with circuit patterns are formed on the substrates 4 to dispose a plurality of chips 7 by an adhesive agent such as Au-alloy which has a higher melting point than the adhesive agent used when the substrates are attached. The chips 7 are wire-bonded with the circuit patterns on the thin films 6. The substrates 4 are usually made of ceramic such as $Al_2O_3$, AlN, BN, SiN, and glass-ceramic or polymer such as polyimide and photosensitive polyimide. Also, a conductor such as Cu, Au, or Al is used for the circuit patterns. In addition, in the case of WSI (wafer scale Integration), Si-substrate can also used.

On the other hand, metal lines 10 are formed on the upper and lower members 1 and 2, and taps 11 are formed at each end of the metal lines 10. These metal lines 10 are wire-bonded with the circuit patterns on each thin film 6. Electrical signals between the metal lines 10 of the upper member 1 and that of the lower member 2 are transmitted mutually by conductors 13 which are transversely inserted through the upper and lower members 1 and 2. Also, the metal lines 10 of the lower member 2 are extended to the outside and connected to external pads 14. External leads 15 are fixed to the respective external pads 14 by a brazing material. The metal lines 10 and the conductors 13 are generally made of W or Mo-Mn in consideration of the upper and lower members 1 and 2 which are formed of ceramic.

On the other hand, heat sinks 16 are formed at the outside of the pads 3 which are formed at the center of the upper and lower members 1 and 2. These heat sinks 16 are formed of fin-pin shape with Al or Au of good thermal emissivity. Also, the heat sinks 16 are attached by an adhesive agent of high thermal conductivity such as soft-solder. Also, Connecting pads 18 are inserted to electrically connect the upper and lower members 1 and 2 with each other and, then the upper and lower members 1 and 2 are sealed with a metal sealing material.

The method of manufacturing the semiconductor package described hereinabove comprises the steps of: preparing the upper and lower members 1 and 2 at the center of which the brazed pads of Cu-W or Cu-Mo are formed, attaching the substrates 4 loaded with a plurality of chips 7 on each member 1 and 2, interconnecting the loaded chips 7 in the members 1 and 2, connecting the upper member 1 to the lower member 2 through connecting pads 18 after stacking the upper and lower members 1 and 2, and forming the heat sinks 16 for emitting internal heat to the outside.

To describe this method in more detail, the step for attaching the substrates on the upper and lower members 1 and 2 comprises the substeps of: contacting the pads 3 to the upper and lower members 1 and 2 by the brazing material of high thermal conductivity after inserting the pads 3 in the center portion of the upper and lower members 1 and 2, attaching the chips 7 to the substrates 4 on which one side the thin film 6 is formed by the adhesive agent 8, attaching the substrates 4 to the upper and lower members 1 and 2 by the adhesive agent 5, and wire-bonding the circuit patterns on the thin film 6 with the chips.

Next, the step for interconnecting the chips in the upper and lower members 1 and 2 comprises the substeps of: forming the taps 11 at the ends of the metal lines which are buried in the upper and lower members 1 and 2, wire-bonding the circuit patterns on the substrates with the taps 11 by wire 12; connecting the conductors 13 for connecting the upper and lower members 1 and 2 to the metal lines 10, and connecting the external leads 15 to the external pads 14 which are connected to the metal lines 10.

On the other hand, the step for forming the heat sink 16 to exit the internal heat of the semiconductor package 20 comprises the following substeps of: making the heat sinks 16 of fin-pin shape and attaching the heat sinks 16 to the pads 3 of the upper and lower members 1 and 2 by the adhesive agent of thermal conductivity.

Shortly speaking, in the present invention, the chips 7 are disposed to the substrates 4 attached to the upper and lower members 1 and 2, and the pads on the chips 7 are wire-bonded with the circuit patterns on the substrates 4, which are also wire-bonded with the taps 11 formed at the end of the metal lines 10. And the metal lines 10 of the upper and lower members 1 and 2 are connected through the conductor 13 and the connecting pads 18, so that the metal lines 10 of the lower member 2 are connected to the external leads 15. Further, the edges of the upper and lower members 1 and 2 are sealed by the sealing material 19 to keep hermeticity.

According to the invention, the packaging density of the semiconductor package 20 is increased and thus the space to dispose the semiconductor package 20 on the printed circuit board (PCB) is remarkably reduced, so that it is possible to miniaturize the computers.

Further, since the pads 3 formed at the centers of the upper and lower members 1 and 2 are made of Cu-W or Cu-Mo in consideration of the thermal conduction and thermal expansion, the heat conduction efficiency from the inside of the semiconductor package 20 to the heat sinks 16 becomes better, and the heat emission capacity is efficiently improved by forming the fin-pin shape of heat sink 16.

As mentioned hereinabove, according to the invention, the packaging density of the semiconductor package is improved double in view of the conventional one by stacking the upper and lower members and attaching the substrates loaded with the chips in the multistep structure.

Furthermore, the heat emission capacity is extremely increased due to the heat sinks formed at the upper and lower members and thus the semiconductor device is protected against the thermal destruction.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method of manufacturing a semiconductor package comprising the steps of:

forming upper and lower members which are respectively coupled with a pad of Cu-W or Cu-Mo by brazing method.

attaching upper and lower substrates loaded with a plurality of chips on said members, interconnecting said chips on said substrates in the members, connecting of said upper member to said lower member, sealing said upper and lower members together, and forming heat sinks at the outside of said upper and lower members.

2. The method according to claim 1, wherein the step for loading said chips into said substrates after attaching said substrates to each member, comprises the substeps of:

forming a thin film provide with said circuit patterns on each substrate, attaching said chips on each thin film by an adhesive agent, and wire-bonding said circuit patterns with said electrodes of said chips.

3. The method according to claim 1, wherein said connecting step comprises the substeps of:

wire-bonding said circuit patterns on said upper and lower substrates with said metal lines at the inside of said upper and lower members in order to connect electrically said metal lines to an exposed part of said conductors where said upper and lower members meet each other, and connecting metal lines extended to the outside of said lower member with each external lead.

4. The method according to claim 1, wherein said sealing step comprises the substeps of:

inserting said connection pad between said upper and lower members to connect each other, and sealing said upper and lower members by a sealing material.

* * * * *